United States Patent
Komuro et al.

(10) Patent No.: US 7,352,184 B2
(45) Date of Patent: Apr. 1, 2008

(54) MRI APPARATUS WITH HIGH-RESISTANCE MAGNET

(75) Inventors: Matahiro Komuro, Hitachi (JP); Yuichi Satsu, Hitachi (JP); Takao Imagawa, Mito (JP); Katsumi Ishikawa, Hitachinaka (JP); Takeyuki Itabashi, Yasugi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/641,757

(22) Filed: Dec. 20, 2006

(65) Prior Publication Data

US 2007/0159171 A1    Jul. 12, 2007

(30) Foreign Application Priority Data

Dec. 22, 2005   (JP) ............................. 2005-368992

(51) Int. Cl.
*G01V 3/00* (2006.01)

(52) U.S. Cl. ........................................ 324/319; 324/320

(58) Field of Classification Search ........ 324/300–322; 600/431, 8; 623/1.15, 1.46; 424/422, 423; 174/350, 353; 427/128; 428/900

See application file for complete search history.

(56) References Cited

U.S. PATENT DOCUMENTS

6,201,394 B1 *   3/2001   Danby et al. ............... 324/319
6,783,059 B2 *   8/2004   Laskaris et al. ........... 324/318

FOREIGN PATENT DOCUMENTS

JP    2000-166898    6/2000
JP    2003-282312    10/2003

* cited by examiner

*Primary Examiner*—Brij Shrivastav
(74) *Attorney, Agent, or Firm*—Antonelli, Terry, Stout & Kraus, LLP.

(57) ABSTRACT

Eddy current generated around a magnetic circuit in an MRI apparatus is one of the causes of deviation from an ideal magnetic field gradient waveform and causes image distortion, loss of strength, ghost generation, loss of signal, and spectral distortion. An object of the present invention is to suppress the generation of the eddy current. In an MRI apparatus, a ferromagnetic material formed from powder is used in a part of a magnetic circuit: the powder mainly comprising a mother phase containing iron or cobalt and showing ferromagnetism; and a high-resistance layer having a resistance not less than ten times as high as the mother phase and a Vickers hardness lower than that of the mother phase being formed in layers along parts of the surface of the powder on parts or the entire of the surface.

9 Claims, 3 Drawing Sheets

MRI APPARATUS WITH HIGH-RESISTANCE MAGNET

CLAIM OF PRIORITY

The present application claims priority from Japanese application serial No. 2005-368992, filed on Dec. 22, 2005, the content of which is hereby incorporated by reference into this application.

BACKGROUND OF THE INVENTION

The present invention relates to an MRI apparatus to which a high-resistance magnet is applied and a production method of the high-resistance magnet.

In a conventional MRI apparatus in which a ferromagnetic material is used, magnetic field gradient combines with a shield and an electrically conductive structure in a magnet and thereby eddy current is generated as described in JP-A No. 166898/2000. Because of the eddy current, the increase and attenuation of magnetic field gradient are observed during and after the application of a trapezoidal current pulse to a gradient coil and the phenomenon leads to image distortion.

In the conventional invention as stated above, a magnetic material that is likely to cause eddy current is used. The eddy current is one of the causes of deviation from an ideal magnetic field gradient waveform and causes image distortion, loss of strength, ghost generation, loss of signal, and spectral distortion. In order to suppress eddy current and reduce hysterisis that causes loss, a high-resistance layer is applied to parts of a permanent magnet and a soft magnetic material, thus the high-resistance layer reduces eddy current flowing among particles in those members and enhances the heat resistance thereof, and hysterisis is reduced by heat treatment and the like.

SUMMARY OF THE INVENTION

In order to attain above object, it is effective to form a membrane high-resistance layer at the grain boundaries of a permanent magnet or a soft magnetic material, and thereby eddy current can be suppressed. Various preferable proposals are applied to such a high-resistance layer. For example, the high-resistance layer is formed by a fluorine compound; it is preferable to increase the interface between the fluorine compound and a main phase, to reduce the thickness of the fluorine compound; and to make the fluorine compound comprise a ferromagnetic phase. First, it is effective to adopt a means by which the fluorine compound takes a layer, membrane, or flat shape when the fluorine compound is formed on the surface of magnetic powder. The magnet of an MRI apparatus is electrically conductive, and that causes the problem of magnetic field gradient-fluctuation caused by eddy current or the variation of the magnetic field of the magnet by heat generation caused by the eddy current. Then to control such a problem, a shielding material is used in conventional technique. By exchanging the magnet for MRI from an electrically conductive magnet to a non-conductive or low-conductive magnet having a high-resistance layer, such a shield or a soft magnetic laminated material as mentioned above which has heretofore been used is not necessarily required. Thereby the expansion of measuring space, the improvements of magnetic field generation efficiency, and MR image quality can be realized. In order to attain such effects, it is necessary to increase the resistance of such a magnet.

The techniques for that are described below.

With regard to the increase of the resistance of a rare-earth magnet, a means thereof is disclosed in JP-A No. 282312/2003 as a conventional example. According to the disclosure, when $NdF_3$ is used as a high-resistance material, $NdF_3$ powder and NdFeB alloy powder of 0.2 μm in average grain diameter respectively are mixed in an automatic mortar, but the shape of the fluorine compound is not described, and the shape of the fluorine compound after sintered is a massive form. In contrast, in the present invention, it proposes a high-resistance magnet applied to an MRI apparatus. For example, a fluorine compound to be the high-resistance layer is formed on the surface of magnetic powder as the magnet for MRI by applying surface treatment. The surface treatment is a means of applying a fluorine compound or a fluorine compound containing one or more kinds of alkali metals, alkali-earth metals, or rare-earth elements on the surface of magnetic powder. A gel or sol fluorine compound is smashed in an alcohol solvent, applied on the surface of magnetic powder, and thereafter heated to remove the solvent. The solvent is removed through heat treatment in the temperature range of 200° C. to 400° C. and the fluorine compound is grown through heat treatment in the temperature range of 500° C. to 800° C. For the heat treatment, in addition to externally heating type furnaces such as an electrical resistance heating furnace, an infrared heating furnace, a high-frequency induction heating furnace, and the like, a millimeter wave heating furnace can be used. In a millimeter wave heating furnace, materials are designed so that a high-resistance layer formed on the surface of magnetic powder may be more likely to generate heat than the magnetic powder. That is, by selecting the combination of materials so that the dielectric loss of a high-resistance layer may be larger than that of magnetic powder at a certain temperature, only the high-resistance layer is heated more than the main phase of the magnetic powder and diffusion advances in accordance with the heating of the vicinity of the high-resistance layer. A high-resistance layer can be applied to magnetic powder such as magnet powder, magnetic powder for sintering, anisotropic rare-earth magnet powder, isotropic magnet powder, and soft magnetic powder. The outermost surface layer of such magnetic powder partially reacts with the high-resistance layer; an alkali metal, an alkali-earth metal, or a rare-earth element constituting the high-resistance layer causes substitution reaction with the outermost surface layer; and thus adhesiveness is secured. When a fluorine compound is formed on magnetic powder containing oxygen and heated to a temperature of about 350° C. or higher, the oxygen diffuses. Oxide in magnetic powder combines with a rare-earth element in the magnetic powder in most cases, and such oxygen diffuses into the fluorine compound by the heating and forms an oxyfluorine compound (which is a substance formed by introducing oxygen into a part of a fluorine compound). The oxyfluorine compound is more brittle than a fluorine compound and hence exfoliation from magnetic powder is likely to occur. This is because hardness the oxyfluorine increases and deformation thereof is hardly caused by introducing oxygen into a fluorine compound. Thus cracks tend to appear in the vicinity of the fluorine compound, formability deteriorates, and a high density is hardly obtained. Therefore, it is important to control the oxygen concentration in magnetic powder when a high-resistance layer is formed on the surface of the magnetic powder. Oxide and fluoroxide are likely to be formed at the interface with magnetic powder and formability deteriorates. Instead of the surface treatment, it is possible to make fluorine and a rare-earth element adhere on the surface of the magnetic powder by sputtering from a fluorine compound target in a decompressed atmosphere. Each of a fluorine compound and an oxyfluorine compound has a face centered cubic lattice structure as its crystal structure and the lattice constant is in the range of 0.54 to 0.60 nm. The growth of such a fluorine compound and an oxyfluorine compound, by removing oxygen in magnetic powder, exhibits the effects of the increase of residual magnetic flux density, the increase of magnetic coercive force, the improvement of the squareness of a demagnetization curve, the reduction of the temperature dependency of magnetic properties, the improvement of thermal demagnetizing properties, the improvement of magnetizability, the improvement of anisotropy, the improvement of corrosion resistance, and others.

As stated above, it is possible to compatibly obtain a high magnetic coercive force, a high residual magnetic flux density, and a high resistance by forming a fluorine compound into a membrane or layer shape at the grain boundaries of alloy of an NdFeB, NdFeCoB, or SmCo type; to avoid the use of an eddy current inhibitor by using such a fluorine compound for a magnetic circuit in an MRI apparatus; and thus to expand a space to be measured and improve the quality of a measured image.

DETAILED DESCRIPTION OF THE PREFERRED EMBODIMENTS

Examples of the present invention are shown hereunder.

EXAMPLE 1

Figure 1:
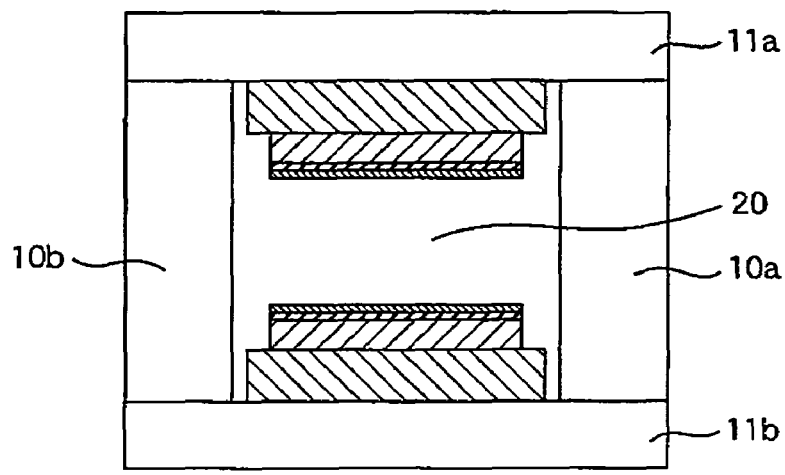
FIG. 1 is an overall configuration view showing an example of a static magnetic field generator for an MRI apparatus according to the present invention.

An example of an apparatus is shown in FIG. 1. In FIG. 1, a pair of permanent magnets 1 supported with upper and lower yokes 11a and 11b, respectively, are disposed at upper and lower positions that interpose a space 20 into which an object to be measured is inserted. The upper and lower yokes 11a and 11b are supported with columns 10a and 10b. A closed magnetic circuit comprised of the upper and lower yokes 11a and 11b and columns 10a and 10b is formed outside the permanent magnets 1. In order to suppress eddy current and reduce hysterisis causing magnetic-circuit loss, a high resistance layer is applied to the grain boundaries in the permanent magnet 1 and soft magnetic material. Here the permanent magnet with the high resistance layer is also referred as a high resistance magnet, and it is used for a part of a sintered magnet. The soft magnetic with the high resistance layer is also referred as a high resistance soft magnetic, it is used for parts of the yokes 11a and 11b. By using such high resistance magnet and magnetic material for a part of the magnet and yoke, in other words a part of the closed magnetic circuit, it is possible to reduce eddy current flowing among particles of the magnet and magnetic material. Therefore the loss of the magnetic circuit can be reduced.

Figure 2:
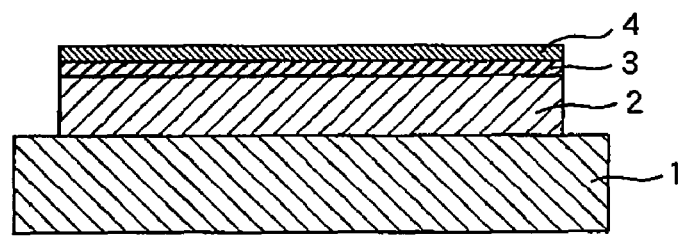
FIG. 2 is an enlarged sectional view showing the base section of a static magnetic field generator according to the present invention.

In FIG. 2, a high frequency irradiation coil 4 and a gradient magnetic field coil 3 to make a magnetic resonance image are disposed on the a base 2. The high frequency irradiation coil 4 plays the role of irradiating an object to be measured with pulse-shaped electromagnetic waves in order to magnetically excite the magnetic moment of protons in the object to be measured. Then the gradient magnetic field coil 3 plays the role of giving positional information to MR signals. In the case where an electromagnetic wave absorber other than an object to be measured exists in a peripheral magnetic circuit, when electromagnetic waves are applied to the object to be measured with a high frequency irradiation coil 4, the efficiency of the electromagnetic waves in the irradiation of the object to be measured lowers. In order to suppress the lowering of the efficiency, a gradient magnetic field coil 3 is disposed next to the high frequency irradiation coil 4. A shield or an eddy current inhibitor has heretofore been disposed between a gradient magnetic field coil 3 and a permanent magnet 1 or a base 2. In the present example, the high resistance magnet is applied to the base 2 or the permanent magnet 1. The high resistance magnet is a material having a resistance (specific resistance) higher than or equal to ten times as high as a conventional NdFeB type, NdFeCoB type, or other type rare-earth magnet, and eddy current hardly flows due to the high resistance. For this reason, an apparatus without an eddy current inhibitor can be configured and leads to the increase of magnetic field strength, the increase of a space for an object to be measured, and the improvement of image quality.

Figure 3:
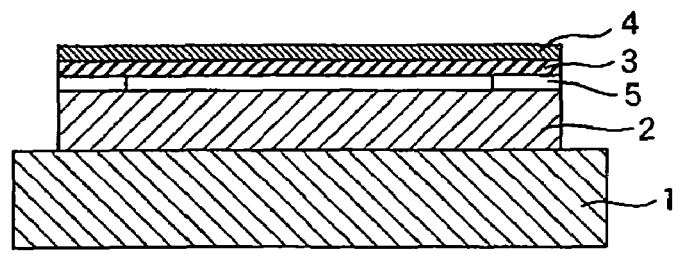
FIG. 3 is an enlarged sectional view showing the base section of another static magnetic field generator according to the present invention.
Figure 4:
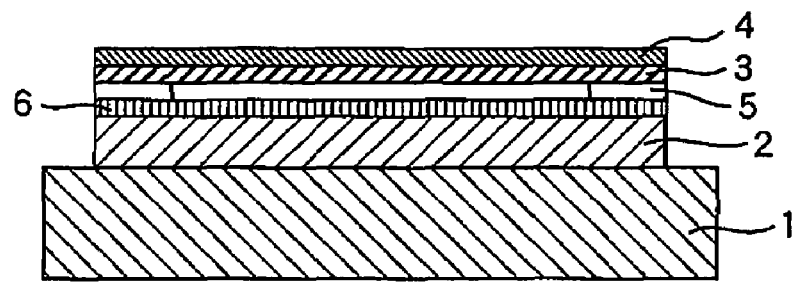
FIG. 4 is an enlarged sectional view showing the base section of yet another static magnetic field generator according to the present invention.

When a magnet resistance is less than 100 times (15 mΩcm) of 0.15 mΩcm that is the specific resistance of a sintered magnet resistance, eddy current at a high frequency magnetic field cannot be ignored. In such a case, eddy current is suppressed, as shown in FIG. 3, by applying a high-resistance magnet to a base 2 or a permanent magnet 1 and by forming a space with a non-magnetic material 5 between a gradient magnetic field coil 3 adjacent to a high frequency irradiation coil 4 and the base 2; and thus reducing the high frequency magnetic field strength of the base 2. In another case where a magnet resistance is less than 100 times (15 mΩcm) of 0.15 mΩcm that is the specific resistance of a sintered magnet resistance, eddy current at a high frequency magnetic field cannot be ignored and hence eddy current at a base 2 is suppressed by, as shown in FIG. 4: applying a high-resistance magnet to the base 2 or a permanent magnet 1; and forming a space with a non-magnetic material 5 and disposing a high-resistance soft magnetic material 6 between a gradient magnetic field coil 3 adjacent to a high frequency irradiation coil 4 and the base 2.

Figure 5A:
FIGS. 5A to 5C are views showing processes of giving high-resistance on the surface of a magnet.
Figure 5B:
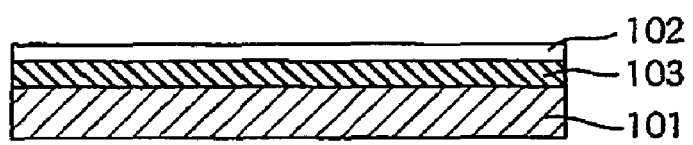
Figure 5C:

In order to configure such a magnetic circuit as stated above, a method of forming a high-resistance magnet to a part or the entire of the surface of a sintered magnet is shown below. As shown in FIGS. 5A to 5C, a fluorine compound 102 containing a rare-earth or alkali-earth metal is formed to a thickness of 0.1 μm or more on the surface of a sintered magnet 101 by the sputtering method or the surface treatment method that will be shown in the following example. Thereby an interface is formed between the fluorine compound and the sintered magnet as shown in FIG. 5A. The product is subjected to heat treatment at a temperature of 400° C. or higher, thereby reaction occurs between the fluorine compound and the sintered magnet, and resultantly a high-resistance layer 103 grows. Although the fluorine compound 102 before reacted is non-magnetic, the high-resistance layer 103 is ferromagnetic since the mother phase thereof is the main constituent phase of the sintered material and has a structure wherein the fluorine compound grows into a layer shape. Then, when a high frequency magnetic field is applied to the vicinity of the surface layer, the eddy current in the surface layer can be suppressed. The process can yield not only the effect in the case of a sintered magnet but also the similar effect in the case of an Fe type soft magnetic material. In the case of a soft magnetic material, it is possible to reduce hysterisis loss by applying heat treatment at 400° C. or higher, and to reduce eddy current loss by giving high resistance. Heat generation in a magnetic circuit can be suppressed by the reduction of hysterisis loss and a corrective circuit to correct the variation of temperature can be simplified.

Figure 6A:
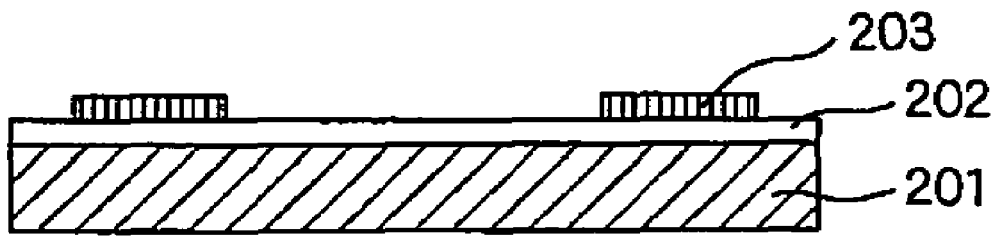
FIGS. 6A to 6C are views showing other processes of giving high-resistance on the surface of a magnet.
Figure 6B:
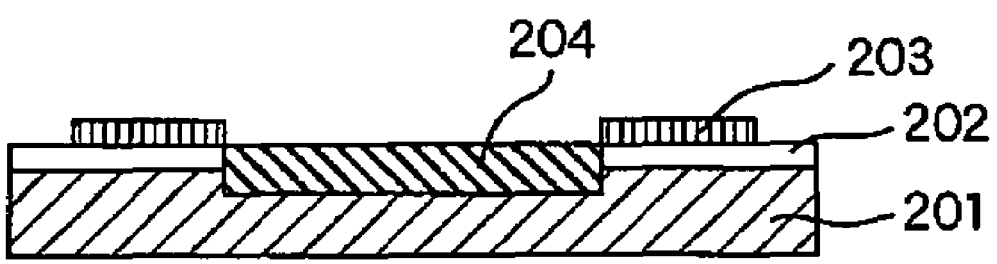
Figure 6C:
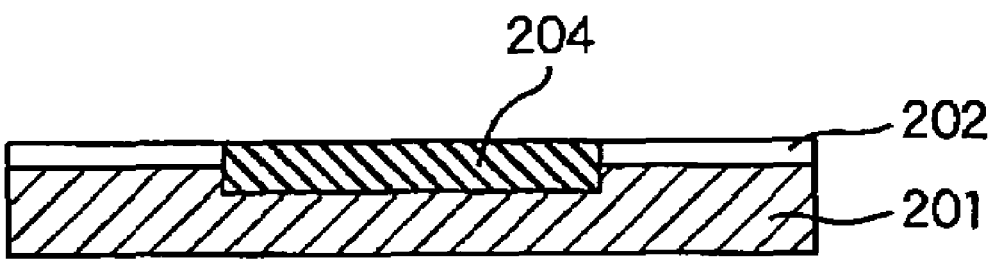

The case where a part of the surface of a sintered magnet 201 is made of a high-resistance layer is explained in reference to FIGS. 6A to 6C. In FIGS. 6A to 6C, a fluorine compound 202 is formed on the surface of the sintered magnet 201 by the vapor deposition method such as sputtering, or surface treatment or coating using a solution. The fluorine compound 202 may take an amorphous structure or may partially include impurities such as a solvent. A reflective layer 203 that is likely to reflect millimeter waves having a frequency of giga-hertz is formed on the fluorine compound 202 through a process such as lift-off. There are some materials that generate heat by the irradiation of millimeter waves among rare-earth fluorine compounds. Hence it is possible to locally heat a material even when the whole material is irradiated with the millimeter waves. In FIGS. 6A to 6C, by using $NdF_3$ that is likely to be heated by the irradiation of millimeter waves as the fluorine compound 202, $NdF_3$ surrounded by the reflective layer 203 generates heat and, by interface diffusion, a high-resistance layer 204 grows in the sintered magnet 201. The high-resistance layer 204 diffuses along the crystal grain boundaries and defects of the mother phase constituting the sintered magnet, grows into a layer shape, and bears a high-resistance. The reflective layer can be removed by etching or milling and a high-resistance layer 204 showing ferromagnetism can be formed next to the fluorine compound 202 showing non-magnetism. This means can be applied also to partially increasing the resistance of a ferromagnetic film. Further, the means can be applied also to an Fe or Co type soft magnetic material.

Magnets described in the following examples can be applied to the aforementioned high-resistance magnets.

NdFeB alloy powder is formed by being smashed into an average grain diameter of 1 to 10 μm and $NdF_3$ is applied on the surface of the NdFeB powder by sputtering. A target formed from $NdF_3$ powder or a mixture of $DyF_3$ and $NdF_3$ is used as the sputtering. As a result of the sputtering, a layer containing fluoride is formed on the surface of the NdFeB alloy powder in an atmosphere of an argon gas or a mixed gas comprising argon and fluorine. Incidentally the powder surface is cleaned by reverse sputtering or the like before the sputtering of the fluoride, thus the oxidized layer on the powder is removed, and the oxygen concentration in the powder is controlled to 3,000 ppm or lower. Vibration or rotary motion is applied to the NdFeB alloy powder, and a layer containing fluoride or fluorine is formed all over the surface of the powder. In many cases, a layer of 1 to 10 nm having a composition different from that of the mother phase exists on the surface of the NdFeB alloy powder and an oxidized layer exists in the vicinity of the phase. The thickness of the layer having a rare-earth element content different from that of a mother phase and the thickness of an oxidized layer vary locally and, when the powder is uneven, the thicknesses range from 10 to 100 nm. Here the layer having a rare-earth element content different from that of a mother phase is merely also referred as the layer having a different rare-earth element content. The thickness of the layer containing fluorine and being formed on the surface of powder is required to be more than or equal to 1 to 10 nm that is the thickness range of the layer having the different rare-earth element content. Then, when heat treatment is applied at 600° C. or higher after the layer containing fluorine is formed in order to reduce loss, it is desirable to reduce the thickness of the oxidized layer. The reason is as follows. The oxidized layer and the layer having the different rare-earth element content tend to diffuse into the layer containing fluorine at 600° C. or higher. Thus the structure of the layer containing fluorine varies. Accordingly, the continuity and the crystal structure of the layer containing fluorine cannot be maintained due to defects, the intrusion of oxygen, the diffusion of the rare-earth element, and others in the vicinity of the interface of the layer containing fluorine when the film thickness is thin. For that reason, it is desirable to control the oxygen concentration to 5,000 ppm or less in powder on which fluoride is formed. In the case of an $NdF_3$ film, the layer containing fluorine comprises a mixed layer of $NdF_3$, $NdF_2$, and $NdF_{2-X}$ structurally containing amorphous immediately after the layer is formed by sputtering or another method. By controlling the forming conditions however, it is possible to form a layer containing fluorine of only amorphous, only $NdF_3$, or only $NdF_2$. After such a layer containing fluorine is formed, heat treatment is applied in the temperature range of 600° C. to 800° C. On this occasion, the structure changes largely in the vicinity of a layer containing fluorine and a layer touching the layer containing fluorine. The layer having a rare-earth element content different from that of the mother phase further grows as the heat treatment temperature rises and the oxygen in the oxidized layer diffuses into both the layer containing fluorine and the layer having a different rare-earth element content. When the oxygen concentration is high, the magnetic properties deteriorate as the thickness increases. Therefore, the thickness of the layer containing fluorine is also determined by required magnetic properties. The layer containing fluorine can be formed along the surface of powder and the film thickness distributes in the range of +200% to −50%. In the case of forming powder on which a layer containing fluorine is formed, if the oxygen concentration exceeds 5,000 ppm, the hardness of the layer containing fluorine increases, the layer containing fluorine is hardly deformed, and a high-density compact cannot be obtained. Meanwhile, in order to reduce eddy current loss, it is desirable that the resistance of the layer containing fluorine is more than or equal to ten times as high as the mother phase. A rare-earth fluorine compound exhibits a resistance more than or equal to ten times as high as an Fe alloy as the mother phase and can have a hardness of the same level as that of the Fe alloy. And, by controlling the oxygen concentration to 5,000 ppm or less, the loss of the compact of NdFeB alloy powder can be reduced. Further, examples of the production of other high-resistance magnets are shown below.

NdFeCoB alloy powder is formed by being smashed into an average grain diameter of 1 to 10 µm and DyF$_3$ is applied on the surface of the NdFeCoB powder by sputtering. The content of Co is 1 to 10 at %. A target formed from DyF$_3$ powder is used for sputtering and the resulting layer containing fluoride is formed on the surface of the NdFeCoB alloy powder in an atmosphere of an argon gas or a mixed gas comprising argon and fluorine. Before the sputtering of the fluoride, the powder surface is cleaned by reverse sputtering or the like, thus the oxidized layer is removed, and the oxygen concentration in the NdFeCoB alloy powder is controlled to 3,000 ppm or lower. Vibration or rotary motion is applied to the NdFeCoB alloy powder, and a layer containing fluoride or fluorine is formed all over the surface of the powder. In many cases, a layer of 1 to 10 nm having a composition different from that of the mother phase exists on the surface of the NdFeCoB alloy powder and an oxidized layer exists in the vicinity of the phase. The thickness of the layer containing fluorine and being formed on the surface of powder is required to be more than or equal to 10 nm and, when heat treatment is applied at 400° C. or higher after the layer containing fluorine is formed in order to reduce loss, it is desirable to reduce the thickness of the oxidized layer. The reason is as follows. Diffusion tends to occur between the oxidized layer and the layer containing fluorine at 400° C. or higher. Thus the structure of the layer containing fluorine varies, and hence the continuity and the crystal structure of the layer cannot be maintained due to defects, the intrusion of oxygen, the diffusion of Dy, and others in the vicinity of the interface of the layer containing fluorine when the film thickness is thin. For that reason, it is desirable to control the oxygen concentration to 5,000 ppm or less in powder on which fluoride is formed. The layer containing fluorine is structurally a mixed layer of DyF$_3$, DyF$_2$, and DyF$_{2-X}$ containing amorphous and the oxyfluorine compound of those immediately after the layer is formed by sputtering or another method. By controlling the forming conditions however, it is possible to form a layer containing fluorine of only amorphous, only DyF$_2$, or only CaF$_{2-x}$. After such a layer containing fluorine is formed, heat treatment is applied in the temperature range of 400° C. to 900° C. When forming powder with a layer containing fluorine into a compact in the temperature range of room temperature to 900° C., if the oxygen concentration exceeds 5,000 ppm, the hardness of the layer containing fluorine increases, the layer containing fluorine is hardly deformed, and a high-density compact cannot be obtained. Meanwhile, in order to reduce eddy current loss, it is desirable that the resistance of the layer containing fluorine is higher than or equal to ten times as high as the mother phase. DyF$_3$ or DyF$_2$ exhibits a resistance higher than or equal to than ten times as high as an NdFeCoB alloy as the mother phase and can have a hardness not higher than that of the NdFeCoB alloy. And, by controlling the oxygen concentration to 5,000 ppm or less, the resistance of the compact of NdFeCoB alloy powder can be increased to ten times or more. Examples of the production of other high-resistance magnets are shown below.

When a coated film was formed through surface treatment, the processing liquid for forming a neodymium fluorine compound coated film was prepared as follows:

(1) Four grams of neodymium acetate or neodymium nitrate that was salt having a high water solubility was introduced into water of about 100 mL and dissolved completely with a shaker or an ultrasonic stirrer;

(2) Hydrofluoric acid diluted into about 10% was gradually added by an amount equivalent to the chemical reaction to produce NdF$_3$;

(3) The solution containing the produced NdF$_3$ gelatinously precipitated therein was stirred for one hour or longer with the ultrasonic stirrer;

(4) After the solution was subjected to centrifugal separation at 4,000 rpm, the supernatant liquid was removed and a nearly identical amount of methanol was added;

(5) The methanol solution containing gelatinous NdF$_3$ was stirred and completely suspended, and thereafter stirred for one hour or longer with the ultrasonic stirrer;

(6) The operations (4) and (5) were repeated four times until anions such as acetate ions, nitrate ions, or the like were not detected; and (7) Somewhat suspended solated NdF$_3$ was produced. As the processing liquid, a methanol solution containing NdF$_3$ at the rate of 1 g/15 mL was used.

Successively, NdFeB alloy powder was used as magnetic powder for a rare-earth magnet. The average grain diameter of the magnetic powder was 5 to 200 µm and the magnetic powder was magnetically anisotropic. The processes of forming a coated film of a rare-earth fluorine compound or an alkali-earth metal fluorine compound onto the magnetic powder for the rare-earth magnet were as follows:

(1) When the average grain diameter of the above magnetic powder was 100 µm, 10 mL of a processing solution for forming an NdF$_3$ coated film was added to magnetic powder for a rare-earth magnet of 100 g, and they were mixed until it was confirmed that the entire of the magnetic powder for the rare-earth magnet was wet;

(2) Methanol as the solvent was removed from the mixture of the magnetic powder for the rare-earth magnet and the processing solution for the NdF$_3$ coated film produced in the process (1) under a decompressed pressure of 2 to 5 torr;

(3) The magnetic powder for the rare-earth magnet from which the solvent was removed in the process (2) was transferred into a quartz boat and subjected to heat treatment for 30 min. at 200° C. and for 30 min. at 400° C. under a decompressed pressure of $1 \times 10^{-5}$ torr;

(4) The magnetic powder subjected to heat treatment in the process (3) was transferred into a porous alumina container, decompressed to $1 \times 10^{-5}$ torr, and thereafter heated with millimeter waves. The heating temperature was 400° C. to 800° C.;

(5) A 28 GHz millimeter wave heater made by Fuji Dempa Kogyo Co., Ltd. was used for the millimeter wave heating and the NdF$_3$ coated film was selectively heated after heated to 200° C. at the output of 1 to 10 Kw in an Ar atmosphere; and (6) The magnetic properties of the magnetic powder for the rare-earth magnet subjected to heat treatment in the process (4) were examined and the magnetic powder for the rare-earth magnet was molded.

The results of the magnetic properties of the magnetic powder after subjected to magnetic field orientation and sintering, including the results on the mixture films with DyF$_3$, are shown in Table 1.

TABLE 1

| Mother phase | Coated film | Coated film thickness (nm) | Hk/iHc | Residual magnetic flux density (T) | Magnetic coercive force (kOe) | Resistance (mΩcm) |
|---|---|---|---|---|---|---|
| NdFeCoB | $NdF_3 + DyF_3$ | 10 | 0.95 | 1.3 | 15.5 | 15 |
| NdFeCoB | $NdF_3 + DyF_3$ | 10 | 0.97 | 1.4 | 15.6 | 14 |
| NdFeCoB | $NdF_3 + NdF_2$ | 20 | 0.96 | 1.1 | 15.6 | 13 |
| NdFeCoB | $NdF_3 + NdF_2 + NdOF$ | 20 | 0.89 | 0.9 | 14.5 | 11 |
| NdFeCoB | $NdF_3 + NdF_2 + NdOF$ | 40 | 0.87 | 0.8 | 14.1 | 10 |

When $NdF_3$ is formed on the surface of NdFeB powder of a low oxygen concentration as stated above, $NdF_2$ and $NdF_3$ grow in the vicinity of the interface and the amount of NdOF is smaller than that of the aforementioned fluoride. By suppressing the forming of an oxyfluorine compound, it is possible to prevent the fluoride layer on the surface of the NdFeB powder from peeling off and prevent the fluoride layer from detaching when load is imposed on the NdFeB powder. Oxygen is likely to intrude as an impurity into such a rare-earth fluorine compound. When the concentration of oxygen contained in magnetic powder exceeds 5,000 ppm however, an oxyfluorine compound tends to be formed and to be exfoliated from the magnetic powder. As an oxygen concentration increases, the mechanical properties of the fluorine compound vary, and a high density is hardly obtained at high-temperature compression molding. For that reason, it is necessary to reduce the oxygen concentration. In order to reduce an oxygen concentration, it is important to prevent oxygen and moisture from intruding during the growth of a fluorine compound in a surface treatment process. Examples of using other surface treatment methods are described below.

The processing liquid for forming a neodymium fluorine compound coated film was prepared as follows:

(1) Four grams of neodymium acetate or neodymium nitrate that was salt having a high water solubility was introduced into water of about 100 mL and dissolved completely with a shaker or an ultrasonic stirrer;

(2) Hydrofluoric acid diluted into 10% was gradually added by an amount equivalent to the chemical reaction to produce $NdF_3$;

(3) The solution containing the produced $NdF_3$ gelatinously precipitated therein was stirred for one hour or longer with the ultrasonic stirrer;

(4) After the solution was subjected to centrifugal separation at 4,000 rpm, the supernatant liquid was removed and a nearly identical amount of methanol was added;

(5) The methanol solution containing gelatinous $NdF_3$ was stirred and completely suspended, and thereafter stirred for one hour or longer with the ultrasonic stirrer;

(6) The operations (4) and (5) were repeated four times until anions such as acetate ions, nitrate ions, or the like were not detected; and (7) Somewhat suspended solated $NdF_3$ was produced. As the processing liquid, a methanol solution containing $NdF_3$ at the rate of 1 g/15 mL was used.

Successively, an NdFeB type sintered magnet was used as a rare-earth magnet block. The average grain diameter of the magnet was 1 to 50 μm and the magnet was magnetically anisotropic. The processes of forming a coated film of a rare-earth fluorine compound or an alkali-earth metal fluorine compound onto the rare-earth magnet block were as follows:

(1) One mL of a processing solution for forming an $NdF_3$ coated film was added to a rare-earth magnet of 100 g, and they were mixed until it was confirmed that the entire of the rare-earth magnet was wet;

(2) Methanol as the solvent was removed from the mixture of the rare-earth magnet and the processing solution for the $NdF_3$ coated film produced in the process (1) under a decompressed pressure of 2 to 5 torr;

(3) The rare-earth magnet from which the solvent was removed in the process (2) was transferred into a quartz boat and subjected to heat treatment for 30 min. at 200° C. and for 30 min. at 400° C. under a decompressed pressure of $1 \times 10^{-5}$ torr;

(4) The rare-earth magnet subjected to heat treatment in the process (3) was transferred into a porous alumina container, decompressed to $1 \times 10^{-5}$ torr, and thereafter heated with millimeter waves. The heating temperature was 300° C. to 1,200° C.;

(5) A 28 GHz millimeter wave heater made by Fuji Dempa Kogyo Co., Ltd. was used for the millimeter wave heating and the $NdF_3$ coated film was selectively heated after heated to 200° C. at the output of 1 to 10 Kw in an Ar atmosphere; and (6) The magnetic properties of the rare-earth magnet subjected to heat treatment in the process (4) were examined.

The measurement results of the magnetic properties of the compacts formed by hot forming after the magnetic powder was temporarily formed through magnetic field orientation are shown in Table 2 in relation to the coated films of the rare-earth fluorine compounds.

TABLE 2

| Mother phase | Coated film | Coated film thickness (nm) | Hk/iHc | Residual magnetic flux density (T) | Magnetic coercive force (kOe) | Resistance (mΩcm) |
|---|---|---|---|---|---|---|
| NdFeB | $NdF_3$ | 10 | 0.95 | 1.3 | 30.2 | 15 |
| NdFeB | $NdF_3$ | 10 | 0.97 | 1.2 | 24.6 | 14 |
| NdFeB | $DyF_3$ | 20 | 0.96 | 1.2 | 34.3 | 13 |

TABLE 2-continued

| Mother phase | Coated film | Coated film thickness (nm) | Hk/iHc | Residual magnetic flux density (T) | Magnetic coercive force (kOe) | Resistance (mΩcm) |
|---|---|---|---|---|---|---|
| NdFeB | TbF$_3$ | 20 | 0.89 | 1.3 | 33.9 | 11 |
| NdFeB | NdF$_3$ + DyF$_3$ | 40 | 0.87 | 1.2 | 33.5 | 10 |
| NdFeB | DyF$_2$ | 40 | 0.91 | 1.2 | 30.2 | 18 |
| NdFeB | PrF$_2$ | 40 | 0.98 | 1.2 | 25.5 | 75 |
| NdFeCoB | NdF$_3$ + NdF$_2$ + DyF$_2$ | 20 | 0.93 | 1.4 | 25.5 | 115 |
| NdFeCoB | NdF$_3$ + NdF$_2$ + TbF$_2$ | 20 | 0.94 | 1.4 | 28.2 | 120 |
| NdFeCoB | NdF$_3$ + NdF$_2$ + PrF$_2$ | 30 | 0.96 | 1.3 | 30.3 | 150 |

When NdF$_3$ is formed on the surface of an NdFeB magnet of a low oxygen concentration as stated above, NdF$_2$ and NdF$_3$ grow in the vicinity of the interface and the amount of NdOF is smaller than that of the aforementioned fluoride. It is possible to reduce an oxygen concentration by carrying out the fluorine compound forming process in a dehumidified or temperature-controlled atmosphere, applying heat treatment for forming the fluorine compound at 300° C. to 1,200° C., and adopting heat treatment in a reducing gas atmosphere if necessary. Further, besides Nd fluoride compounds, through similar processes, LiF, MgF$_2$, CaF$_2$, ScF$_3$, VF$_2$, VF$_3$, CrF$_2$, CrF$_3$, MnF$_2$, MnF$_3$, FeF$_2$, FeF$_3$, CoF$_2$, CoF$_3$, NiF$_2$, ZnF$_2$, AlF$_3$, GaF$_3$, SrF$_2$, YF$_3$, ZrF$_3$, NbF$_5$, AgF, InF$_3$, SnF$_2$, SnF$_4$, BaF$_2$, LaF$_2$, LaF$_3$, CeF$_2$, CeF$_3$, PrF$_2$, PrF$_3$, NdF$_2$, NdF$_3$, SmF$_2$, SmF$_3$, EuF$_2$, EuF$_3$, GdF$_3$, TbF$_3$, TbF$_4$, DyF$_2$, DyF$_3$, HoF$_2$, HoF$_3$, ErF$_2$, ErF$_3$, TmF$_2$, TmF$_3$, YbF$_3$, YbF$_2$, LuF$_2$, LuF$_3$, PbF$_2$, BiF$_3$, oxyfluorine compounds of those fluorine compounds, and fluorine compounds that partially lack fluorine can be formed into a layer shape. Among such fluorine compounds, in the case of a fluorine compound, like NdF$_3$, having dielectric loss larger than that of NdFeB at a high temperature of 200° C. or higher, the fluorine compound generates heat by millimeter wave heating, only the vicinities of the parts where the fluorine compound is formed are heated, and hence it is possible to improve the magnetic properties only in the vicinity of the surface layer without deteriorating the internal magnetic properties of an NdFeB sintered body. A block sintered body produced by processing an NdFeB sintered body tends to have a work affected layer on the outermost surface and the magnetic properties tend to deteriorate in the vicinity thereof. In order to correct the deterioration of the magnetic properties, a fluorine compound containing an element that makes magnetic anisotropy large is formed by the aforementioned method or the like and thereafter subjected to millimeter wave heating, thereby the fluorine compound or an oxyfluorine compound generates heat, and thus it is possible to advance the diffusion of a rare-earth element at only the places where the fluorine compound is formed. It has been confirmed that the magnetic coercive force and the squareness of NdFeB improve by the diffusion.

An example of a high-resistance magnet formed through other surface treatment is shown below.

The processing liquid for forming a dysprosium fluorine compound coated film was prepared as follows:

(1) Four grams of dysprosium acetate or dysprosium nitrate that was salt having a high water solubility was introduced into water of about 100 mL and dissolved completely with a shaker or an ultrasonic stirrer;

(2) Hydrofluoric acid diluted into about 10% was gradually added by an amount equivalent to the chemical reaction to produce DyF$_3$;

(3) The solution containing the produced DyF$_3$ gelatinously precipitated therein was stirred for one hour or longer with the ultrasonic stirrer;

(4) After the solution was subjected to centrifugal separation at 4,000 rpm, the supernatant liquid was removed and a nearly identical amount of methanol was added;

(5) The methanol solution containing gelatinous DyF$_3$ was stirred and completely suspended, and thereafter stirred for one hour or longer with the ultrasonic stirrer;

(6) The operations (4) and (5) were repeated four times until anions such as acetate ions, nitrate ions, or the like were not detected; and (7) Somewhat suspended solated DyF$_3$ was produced. As the processing liquid, a methanol solution containing DyF$_3$ at the rate of 1 g/15 mL was used.

Successively, NdFeB alloy powder or SmCo alloy powder was used as magnetic powder for a rare-earth magnet. The above processes can be applied to an Fe alloy containing one or more kinds of rare-earth elements or an alloy containing one or more kinds of rare-earth elements and submetallic elements in the same way as the NdFeB alloy powder. Further, an SmCo alloy is a Co alloy that contains one or more kinds of rare-earth elements and the above processes can be applied also to an alloy produced by adding various elements to the Co alloy. The oxygen concentration of such magnetic powder is in the range of 10 to 3,000 ppm, the average grain diameter thereof is in the range of 1 to 100 μm, and the magnetic powder is magnetically anisotropic. The processes of forming a coated film of a rare-earth fluorine compound or an alkali-earth metal fluorine compound onto the magnetic powder for the rare-earth magnet were as follows:

(1) When the average grain diameter was 10 μm, 15 mL of a processing solution for forming a DyF$_3$ coated film was added to magnetic powder for a rare-earth magnet of 100 g, and they were mixed until it was confirmed that the entire of the magnetic powder for the rare-earth magnet was wet;

(2) Methanol as the solvent was removed from the mixture of the magnetic powder for the rare-earth magnet and the processing solution for the DyF$_3$ coated film produced in the process (1) under a decompressed pressure of 2 to 5 torr;

(3) The magnetic powder for the rare-earth magnet from which the solvent was removed in the process (2) was transferred into a quartz boat and subjected to heat treatment for 30 min. at 200° C. and for 30 min. at 400° C. under a decompressed pressure of 1×10$^{-5}$ torr;

(4) The magnetic powder subjected to heat treatment in the process (3) was transferred into a container and thereafter subjected to heat treatment at 400° C. to 800° C. under a decompressed pressure of 1×10$^{-5}$ torr; and (5) The magnetic properties after forming of the produced magnetic powder for the rare-earth magnet subjected to heat treatment in the process (4) were examined.

The results of the magnetic properties are summarized in Table 3.

TABLE 3

| Mother phase | Coated film | Coated film thickness (nm) | Hk/iHc | Residual magnetic flux density (T) | Magnetic coercive force (kOe) | Resistance (mΩcm) |
|---|---|---|---|---|---|---|
| NdFeCoB | $DyF_3$ | 50 | 0.95 | 1.1 | 18.5 | 15 |
| NdFeCoB | $DyF_3$ | 50 | 0.94 | 1.1 | 19.5 | 14 |
| NdFeCoB | $DyF_3 + DyF_2$ | 50 | 0.93 | 1.1 | 21.5 | 13 |
| NdFeCoB | $DyF_3 + DyF_2 + DyOF$ | 50 | 0.91 | 0.9 | 14.2 | 11 |
| NdFeCoB | $DyF_3 + DyF_2 + DyOF$ | 100 | 0.95 | 0.8 | 13.2 | 10 |
| NdFeCoB | $TbF_3 + TbF_2 + TbOF$ | 100 | 0.97 | 1.0 | 18.8 | 6 |
| NdFeCoB | $TbF_3 + TbF_2 + TbOF$ | 100 | 0.95 | 1.0 | 20.8 | 4 |

In Table 3, the magnetic properties of the magnetic powder formed by applying surface treatment in the same way as the above method to a fluorine compound containing the Tb element in addition to Dy are also shown. Major fluorine compounds formed through surface treatment are described as the fluorine compounds, and phases formed in the vicinities of the interfaces between the magnetic powder and the fluorine compounds are described as the interface phases. Those phases are the phases recognized within about 1,000 nm from the interfaces and can be analyzed through composition analysis, structure analysis, and XRD patterns by TEM, SEM, and AES. When $DyF_3$ was formed on the surface of NdFeCoB powder as stated above, heat treatment was applied for 30 minutes to one hour at 400° C. so that $DyF_2$, $NdF_2$, and $NdO_2$ might grow in the vicinity of the interface. By further advancing heat treatment in a high temperature range of 500° C. to 800° C., Fe grows outside the interface phase. The rare-earth elements are contained in the Fe, and the oxygen concentration in the fluorine compound is higher than that on the surface of the magnetic powder. In the case where another fluorine compound is formed through surface treatment too, Fe having an oxygen concentration lower than that in the fluorine compound grows as long as the heat treatment temperature is higher than 400° C. When the heat treatment temperature is raised as stated above, rare-earth elements, oxygen, and others diffuse between the fluorine compound and the magnetic powder, a part of oxygen in the magnetic powder diffuses in the fluorine compound, and a part of the rare-earth elements in the magnetic powder diffuses in the fluorine compound. An Fe phase (Fe rare-earth alloy) on the surface of the magnetic powder grows by the diffusion and a part of the Fe phase undergoes switched connection with NdFeCoB as the mother phase. The Fe phase contains rare-earth elements and sometimes contains an element added to NdFeB such as Co. Since the saturation magnetic flux density of the Fe phase is higher than that of NdFeB, the magnetization rotation of Fe responding to an external magnetic field is hardly secured by the switched connection with NdFeCoB and the residual magnetic flux density increases. As shown in Table 3, it is understood that the residual magnetic flux density of the magnetic powder wherein Fe is recognized as an interface phase is larger than that of magnetic powder, on which the same fluorine compound is formed, wherein Fe is not recognized as an interface phase. Further, when Fe grows as the interface phase, the maximum energy product and BHmax are large. Here, even when the heat treatment temperature is lower than 400° C., the above Fe phase grows by applying heat treatment for a long period of time.

As another example, the processing liquid for forming a dysprosium neodymium fluorine compound coated film was prepared as follows:

(1) Two grams of dysprosium acetate or dysprosium nitrate that was salt having a high water solubility and two grams of neodymium acetate were introduced into water of about 100 mL and dissolved completely with a shaker or an ultrasonic stirrer;

(2) Hydrofluoric acid diluted into about 10% was gradually added by an amount equivalent to the chemical reaction to produce (Dy, Nd)$F_3$;

(3) The solution containing the produced (Dy, Nd)$F_3$ gelatinously precipitated therein was stirred for one hour or longer with the ultrasonic stirrer;

(4) After the solution was subjected to centrifugal separation at 4,000 rpm, the supernatant liquid was removed and a nearly identical amount of methanol was added;

(5) The methanol solution containing gelatinous (Dy, Nd)$F_3$ was stirred and completely suspended, and thereafter stirred for one hour or longer with the ultrasonic stirrer;

(6) The operations (4) and (5) were repeated four times until anions such as acetate ions, nitrate ions, or the like were not detected; and (7) Somewhat suspended solated (Dy, Nd)$F_3$ was produced. As the processing liquid, a methanol solution containing (Dy, Nd)$F_3$ at the rate of 1 g/15 mL was used.

Successively, NdFeB alloy powder or SmCo alloy powder was used as magnetic powder for a rare-earth magnet. The NdFeB alloy powder is an Fe alloy containing one or more kinds of rare-earth elements or an alloy containing one or more kinds of rare-earth elements and submetallic elements. Further, an SmCo alloy is a Co alloy that contains one or more kinds of rare-earth elements and includes an alloy produced by adding various elements to the Co alloy. The oxygen concentration of such magnetic powder is in the range of 10 to 3,000 ppm, the average grain diameter thereof is in the range of 1 to 100 μm, and the magnetic powder is magnetically anisotropic. The processes of forming a coated film of a rare-earth fluorine compound or an alkali-earth metal fluorine compound onto magnetic powder for a rare-earth magnet were as follows:

(8) When the average grain diameter was 10 μm, 15 mL of a processing solution for forming a (Dy, Nd)$F_3$ coated film was added to magnetic powder for a rare-earth magnet of 100 g, and they were mixed until it was confirmed that the entire of the magnetic powder for the rare-earth magnet was wet;

(9) Methanol as the solvent was removed from the mixture of the magnetic powder for the rare-earth magnet and the processing solution for the (Dy, Nd)$F_3$ coated film produced in the process (1) under a decompressed pressure of 2 to 5 torr;

(10) The magnetic powder for the rare-earth magnet from which the solvent was removed in the process (2) was transferred into a quartz boat and subjected to heat treatment for 30 min. at 200° C. and for 30 min. at 400° C. under a decompressed pressure of $1\times10^{-5}$ torr;

(11) The magnetic powder subjected to heat treatment in the process (3) was transferred into a porous alumina container and thereafter subjected to heat treatment at 400° C. to 800° C. with a millimeter wave heater in an Ar gas atmosphere under a decompressed pressure; and

(12) The magnetic properties of the magnetic powder for the rare-earth magnet subjected to heat treatment in the process (4) were examined.

The results of the magnetic properties are summarized in Table 4.

fluorine compound and the magnetic powder, a part of oxygen in the magnetic powder diffuses in the fluorine compound, and a part of the rare-earth elements in the magnetic powder diffuses in the fluorine compound. An Fe phase (Fe rare-earth alloy) on the surface of the magnetic powder grows by the diffusion and a part of the Fe phase undergoes switched connection with NdFeB as the mother phase. The Fe phase contains rare-earth elements and sometimes contains an element added to NdFeB such as Co. Since the saturation magnetic flux density of the Fe phase is higher than that of NdFeB, the magnetization rotation of Fe responding to an external magnetic field is hardly secured by the switched connection with NdFeB and the residual magnetic flux density increases. As shown in Table 4, it is understood that the residual magnetic flux density of the magnetic powder wherein Fe is recognized as an interface phase is larger than that of magnetic powder, on which the same fluorine compound is formed, wherein Fe is not recognized as an interface. Further, when Fe grows as the interface phase, the maximum energy product and BHmax are large. Here, even when the heat treatment temperature is lower than 400° C., the above Fe phase grows by applying heat treatment for a long period of time.

TABLE 4

| Mother phase | Coated film | Coated film thickness (nm) | Hk/iHc | Residual magnetic flux density (T) | Magnetic coercive force (kOe) | Resistance (mΩcm) |
|---|---|---|---|---|---|---|
| NdFeB | (Dy, Nd)$F_3$ | 20 | 0.97 | 1.45 | 31.3 | 39 |
| NdFeB | (Dy, Nd)$F_3$ | 20 | 0.98 | 1.44 | 32.8 | 45 |
| NdFeB | (Dy, Nd)$F_3$ + (Dy, Nd)$F_2$ | 50 | 0.94 | 1.38 | 37.1 | 29 |
| NdFeB | (Dy, Nd)$F_3$ + (Dy, Nd)$F_2$ + DyOF | 50 | 0.91 | 1.29 | 21.3 | 12 |
| NdFeB | (Dy, Nd)$F_3$ + (Dy, Nd)$F_2$ + (Dy, Nd)OF | 100 | 0.92 | 1.24 | 19.8 | 15 |
| NdFeB | (Tb, Nd)$F_3$ + (Tb, Nd)$F_2$ + (Tb, Nd)OF | 100 | 0.91 | 1.3 | 21.2 | 13 |
| NdFeB | (Tb, Nd)$F_3$ + (Tb, Nd)$F_2$ + (Tb, Nd)OF | 100 | 0.92 | 1.3 | 22.5 | 12 |

In Table 4, the magnetic properties of the magnetic powder on which a fluorine compound containing the Tb element other than Dy is formed through surface treatment in the same way as the above method are also shown. Major fluorine compounds formed through surface treatment are described as the fluorine compounds, and phases formed in the vicinities of the interfaces between the magnetic powder and the fluorine compounds are described as the interface phases. Those phases are the phases recognized within about 1,000 nm from the interfaces and can be analyzed through composition analysis, structure analysis, and XRD patterns by TEM, SEM, and AES. When DyF$_3$ was formed on the surface of NdFeB powder as stated above, heat treatment was applied for 30 minutes to one hour at 400° C. so that DyF$_2$, NdF$_2$, and NdO$_2$ might grow in the vicinity of the interface. By further advancing heat treatment in a high temperature range of 500° C. to 800° C., Fe grows outside the interface phase. Rare-earth elements are contained in the Fe, and the oxygen concentration in the fluorine compound is higher than that on the surface of the magnetic powder. In the case where another fluorine compound is formed through surface treatment too, Fe having an oxygen concentration lower than that in the fluorine compound grows as long as the heat treatment temperature is higher than 400° C. When the heat treatment temperature is raised as stated above, rare-earth elements, oxygen, and others diffuse between the The next method has been studied as a means of producing another high-resistance magnet. An NdFeB alloy is powder being subjected to hydrogenation-dehydrogenation treatment and having grain diameters of 1 to 1,000 μm and the magnetic coercive force of the powder at room temperature is 16 kOe. The oxygen concentration in the NdFeB (the main phase is Nd$_2$Fe$_{14}$B) powder is set at 10 to 3,000 ppm. The fluorine compound to be mixed is NdF$_3$. The NdF$_3$ material powder is smashed beforehand into an average grain diameter of 0.01 to 100 μm, mixed with NdFeB powder, and injected between twin rolls. In order to form the fluorine compound powder into a layer shape, the surface temperature of the rolls is set at 300° C. to 600° C. so that the NdFeB powder and the fluorine compound may easily deform with the rolls. The fluorine compound, together with the NdFeB powder, deforms into a flat shape with the twin rolls. The applied pressure is set at 100 kg/cm$^2$ or more. The fluorine compound is formed in layers on the surface of the magnetic powder pressed with the twin rolls, and, if necessary, the fluorine compound may further be mixed and the magnetic powder may be pressed with the twin rolls. As a fluorine compound to be mixed, listed are, besides NdF$_3$, LiF, MgF$_2$, CaF$_2$, ScF$_3$, VF$_2$, VF$_3$, CrF$_2$, CrF$_3$, MnF$_2$, MnF$_3$, FeF$_2$, FeF$_3$, CoF$_2$, CoF$_3$, NiF$_2$, ZnF$_2$, AlF$_3$, GaF$_3$, SrF$_2$, YF$_3$, ZrF$_3$, NbF$_5$, AgF, InF$_3$, SnF$_2$, SnF$_4$, BaF$_2$, LaF$_2$, LaF$_3$, CeF$_2$, CeF$_3$, PrF$_2$, PrF$_3$, NdF$_2$, NdF$_3$, SmF$_2$, SmF$_3$, EuF$_2$, EuF$_3$, $GdF_3$, $TbF_3$, $TbF_4$, $DyF_2$, $DyF_3$, $HoF_2$, $HoF_3$, $ErF_2$, $ErF_3$, $TmF_2$, $TmF_3$, $YbF_3$, $YbF_2$, $LuF_2$, $LuF_3$, $PbF_2$, and $BiF_3$. When the oxygen concentration in magnetic powder exceeds 3,000 ppm, an oxyfluorine compound, wherein oxygen is combined with the mixed powder and the fluorine compound, is formed more abundantly than the fluorine compound, and the oxyfluorine compound is formed in layers or granularly on the surface of the NdFeB powder.

When the magnetic powder is heated and pressed with the twin rolls, stress is imposed by pressing and hence local strain remains in the powder. It is estimated that the local strain accelerates diffusion at the interface between the magnetic powder and the fluorine compound. The interface between $NdF_3$ and the magnetic powder varies in accordance with the surface temperature of the rolls and comprises $NdF_3/Nd_2Fe_{14}B$, $NdF_3$/Nd-rich phase, $NdF_3/Nd_2O_3$, or the like at a temperature of 400° C. or lower. When the surface temperature of the rolls is raised to higher than 400° C., a part of $NdF_3$ reacts with the magnetic powder and $NdF_2$ is formed. At the same time, NdOF is also formed. Oxygen intrudes also into $NdF_2$ and, at a temperature higher than 400° C., the oxygen and the rare-earth element in the magnetic powder diffuse in the fluorine compound. By the diffusion, the oxygen concentration in the magnetic powder reduces and, in addition to the increase of resistance, any one of the effects such as the increase of residual magnetic flux density, the increase of magnetic coercive force, the improvement of the squareness of a magnetization curve, the reduction of thermal demagnetization, and others can be confirmed.

In the production of a high-resistance magnet to which a fluorine compound is applied, any one of such various kinds of methods as stated below is adopted. The first is the case of forming a high-resistance layer containing a fluorine compound on the surface of a sintered magnet block. In this case, a part or the entire of the surface of plural magnet blocks is coated with a high-resistance layer containing a fluorine compound. As the method, surface treatment or vapor deposition such as sputtering can be adopted. In the case of sputtering, it is also possible to form: a high-resistance layer comprising only a nitrogen compound such as BN or TiN or carbide; or a mixed layer with a fluorine compound. By irradiating a magnet block on which a surface film comprising those compounds is formed with millimeter waves having a GHz frequency, only the vicinity of the compound film is selectively heated, and resultantly exfoliation can be avoided and magnetic properties can be improved. In the case where a compound containing an element that makes anisotropy larger than that of the mother phase of a magnet block is formed in particular, the effect of the improvements of magnetic coercive force and squareness can be confirmed.

The second case is the case where a compound containing a halogen element such as a fluorine compound, a nitrogen compound, or a carbon compound is formed on the surface of magnetic powder by a method such as surface treatment or sputtering. In this case, solution treatment is effective for the reduction of the process cost, and thereby a layer fluorine compound can be formed along the surface of the magnetic powder and the resistance of the magnetic powder can be increased. When the magnetic powder is interposed between electrodes and the IV characteristic is measured, a high-resistance layer withstanding dielectric breakdown at a voltage of 100 V or lower can be formed. When the magnetic powder comprises an Fe type or Co type rare-earth magnet such as SmCo or NdFeB, the hardness of the high-resistance layer having a fluorine compound as the mother phase is lower than that of the rare-earth magnet and the high-resistance layer can be deformed. Therefore, it is possible to produce: a magnet that uses a fluorine compound as the binder; or a bonded magnet formed by mixing a resin with surface-treated magnetic powder and applying injection, compression, or extrusion molding. In general, if it is attempted to reduce the volume of the binder material of a bonded magnet and improve magnetic properties, the particles of the magnetic powder tend to touch each other and the resistance tends to lower. By using the aforementioned surface-treated magnetic powder however, it is possible to reduce the binder volume to 1 to 10% while the high resistance of the magnet is maintained. The improvements of magnetic properties and reliability can be obtained also by irradiating surface-treated magnetic powder with millimeter waves. Thus by irradiating magnetic powder on which a fluorine compound is formed with millimeter waves, making the fluorine compound generate heat, and accelerating the diffusion of a rare-earth element, the effects of the improvements of magnetic coercive force, squareness, and residual magnetic flux density, the removal of impurities in the fluorine compound layer, the improvement of adhesiveness between the fluorine compound and the magnetic powder, the reduction of thermal demagnetization, and others can be confirmed. Thirdly, by forming a fluorine compound on powder of an Fe, Co, or another type other than magnetic powder and irradiating them with millimeter waves, it is possible to heat only the vicinity of the fluorine compound and further, as the grain diameter of the powder increases, the thermal effect is suppressed in the interior of the powder and the fluorine compound generates heat, and hence it is possible to improve magnetic properties and bind and sinter the fluorine compound between plural powder grains only in the vicinity of the surface.

The present invention is applied to the field of, in an MRI (Magnetic Resonance Imaging) system, using a ferromagnetic material to suppress eddy current and providing a static magnetic field having spatially and temporally uniform strength and orientation.

What is claimed is:

1. An MRI apparatus comprising:
   a ferromagnetic material formed from powder; and
   a magnetic circuit using said ferromagnetic in a part thereof;
   wherein said powder to be mainly a mother phase of said ferromagnetic material contains iron or cobalt with ferromagnetism; and
   said powder is provided with a high-resistance layer which has a resistance higher than or equal to ten times as high as said mother phase and a Vickers hardness lower than that of said mother phase, and that is formed in layer structure along the surface of said powder on parts or the entire of said surface.

2. An MRI apparatus comprising:
   a ferromagnetic material formed from powder; and
   a magnetic circuit using said ferromagnetic in a part thereof;
   wherein said powder to be mainly a mother phase of said ferromagnetic material contains iron or cobalt with ferromagnetism; and
   said powder is provided with a high-resistance layer which has a resistance higher than or equal to ten times as high as said mother phase and a Vickers hardness lower than that of said mother phase at room temperature, and that is formed in layer structure with the thickness of 10 to 10,000 nm along the surface of said powder on parts or the entire of said surface.

3. An MRI apparatus comprising:
a static magnetic field generator for forming a static magnetic field having a uniform magnetic field strength distribution in a measuring space; and
a ferromagnetic material for adjusting the uniformity of said magnetic field in said measuring space;
wherein said ferromagnetic is comprised of an iron or cobalt type material characterized by a high resistance.

4. An MRI apparatus comprising:
a static magnetic field generator for forming a static magnetic field having a uniform magnetic field strength distribution in a measuring space;
a ferromagnetic material for adjusting the uniformity of said magnetic field in said measuring space; and
a pair of permanent magnets disposed on opposite sides of said measuring space in said static magnetic field generator;
wherein said permanent magnets are comprised of an iron or cobalt type material characterized by a high resistance.

5. An MRI apparatus comprising:
a static magnetic field generator for forming a static magnetic field having a uniform magnetic field strength distribution in a measuring space;
a ferromagnetic material for adjusting the uniformity of said magnetic field in said measuring space; and
a pair of permanent magnets disposed on opposite sides of said measuring space in said static magnetic field generator so as to face said measuring space of magnetic poles in said static magnetic field generator;
wherein said permanent magnets are comprised of an iron or cobalt type material characterized by a high resistance.

6. An MRI apparatus comprising:
a static magnetic field generator for forming a static magnetic field having a uniform magnetic field strength distribution in a measuring space;
a ferromagnetic material for adjusting the uniformity of said magnetic field in said measuring space; and
a pair of permanent magnets and high-frequency shields disposed on opposite sides of said measuring space in said static magnetic field generator so as to face said measuring space of magnetic poles in said static magnetic field generator;
wherein said permanent magnets or high-frequency shields are comprised of an iron or cobalt type material characterized by a high resistance.

7. An MRI apparatus comprising:
a static magnetic field generator for forming a static magnetic field having a uniform magnetic field strength distribution in a measuring space;
a ferromagnetic material for adjusting the uniformity of said magnetic field in said measuring space; and
a pair of permanent magnets and high-frequency shields disposed on opposite sides of said measuring space in said static magnetic field generator so as to face said measuring space of magnetic poles in said static magnetic field generator;
wherein said permanent magnets or high-frequency shields are comprised of an iron or cobalt type material whose grain boundaries are provided with high resistance layers;
wherein said high-resistance layers comprise fluorine compounds.

8. An MRI apparatus comprising:
a static magnetic field generator for forming a static magnetic field having a uniform magnetic field strength distribution in a measuring space;
a ferromagnetic material for adjusting the uniformity of said magnetic field in said measuring space; and
a pair of permanent magnets and high-frequency shields disposed on opposite sides of said measuring space in said static magnetic field generator so as to face said measuring space of magnetic poles in said static magnetic field generator;
wherein said permanent magnets or high-frequency shields are comprised of an iron or cobalt type material whose grain boundaries are provided with high resistance layers;
wherein said high-resistance layers comprise oxyfluorine compounds.

9. An MRI apparatus according to any one of claims 1 to 8, wherein said a magnetic material characterized in that a high-resistance layer is a fluorine compound containing fluorine and one or more kinds of an alkali metal, an alkali-earth metal, a transition metal, and a rare-earth metal is used.

* * * * *